(12) United States Patent
Chen et al.

(10) Patent No.: US 6,734,493 B2
(45) Date of Patent: May 11, 2004

(54) LATERAL DOUBLE DIFFUSED METAL OXIDE SEMICONDUCTOR (LDMOS) DEVICE WITH ALIGNED BURIED LAYER ISOLATION LAYER

(75) Inventors: Shih-Hui Chen, Kaohsiung (TW); Chi-Hung Kao, Taipei (TW); Jeng Gong, Hsinchu (TW); Kuo-Hsu Huang, Hsinchu (TW); Meng-Chi Wu, Hsinchu (TW); Jia-Rong Yu, Keelung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 1 day.

(21) Appl. No.: 10/071,431

(22) Filed: Feb. 8, 2002

(65) Prior Publication Data
US 2003/0151088 A1 Aug. 14, 2003

(51) Int. Cl.[7] .............................................. H01L 29/72
(52) U.S. Cl. ...................... 257/328; 257/327; 257/336; 257/401; 257/492
(58) Field of Search ................................. 257/327, 336, 257/401, 492, 328

(56) References Cited

U.S. PATENT DOCUMENTS

| 5,146,298 A | 9/1992 | Eklund |
| 6,288,424 B1 * | 9/2001 | Ludikhuize .................. 257/335 |

* cited by examiner

*Primary Examiner*—Edward Wojciechowicz
(74) *Attorney, Agent, or Firm*—Tung & Associates

(57) ABSTRACT

Within both a lateral double diffused metal oxide semiconductor (LDMOS) device, and a method for fabrication thereof, there is formed a buried layer of polarity equivalent with a well region within which is formed a drain region. The buried layer is formed laterally aligned with respect to the well region, and separated therefrom by a portion of an epitaxial layer. The lateral double diffused metal oxide semiconductor (LDMOS) device exhibits enhanced electrical performance.

5 Claims, 3 Drawing Sheets

LATERAL DOUBLE DIFFUSED METAL OXIDE SEMICONDUCTOR (LDMOS) DEVICE WITH ALIGNED BURIED LAYER ISOLATION LAYER

BACKGROUND OF THE INVENTION

1. Field of the Invention

The present invention relates generally to lateral double diffused metal oxide semiconductor (LDMOS) devices. More particularly, the present invention relates to lateral double diffused metal oxide semiconductor (LDMOS) devices with enhanced performance.

2. Description of the Related Art

Semiconductor integrated circuit microelectronic fabrications are formed from semiconductor substrates within and upon which are formed semiconductor devices, and over which are formed patterned microelectronic conductor layers which are separated by microelectronic dielectric layers.

Common in the art of semiconductor integrated circuit microelectronic fabrication are logic semiconductor integrated circuit microelectronic fabrications, memory semiconductor integrated circuit microelectronic fabrications and embedded (i.e., integrated logic and memory) semiconductor integrated circuit microelectronic fabrications which operate at a generally low supply voltage of from about 2.5 to about 5.0 volts. Such semiconductor integrated circuit microelectronic fabrications are typically fabricated while employing conventional field effect transistor (FET) devices which comprise a semiconductor substrate having formed therein a pair of source/drain regions separated by a channel region, over which channel region is formed a gate electrode.

Considerably less prevalent, but nonetheless also conventional in the art of semiconductor integrated circuit microelectronic fabrication, are semiconductor integrated circuit microelectronic fabrications which operate at considerably higher operating voltages in a range of from about 5 to about 1000 volts. Such semiconductor integrated circuit microelectronic fabrications are often employed as switching elements within higher voltage or higher current electrical circuit applications. In addition, such semiconductor integrated circuit microelectronic fabrications are often fabricated while employing lateral double diffused metal oxide semiconductor (LDMOS) devices. Lateral double diffused metal oxide semiconductor (LDMOS) devices are field effect transistor (FET) devices which bear a certain resemblance to conventional field effect transistor (FET) devices insofar as they also comprise a pair of source/drain regions formed within a semiconductor substrate and separated in part by a channel region also formed within the semiconductor substrate, the channel region in turn having formed thereover a gate electrode. However, lateral double diffused metal oxide semiconductor (LDMOS) devices differ from conventional field effect transistor (FET) devices in part insofar as while a pair of source/drain regions within a field effect transistor (FET) device is typically fabricated symmetrically with respect to a gate electrode within the field effect transistor (FET) device, within a lateral double diffused metal oxide semiconductor (LDMOS) device a drain region is formed further separated from a gate electrode than a source region, and the drain region is additionally formed within a doped well (of equivalent polarity with the drain region) which separates the drain region from the channel region.

While lateral double diffused metal oxide semiconductor (LDMOS) devices are thus clearly desirable within the art of semiconductor integrated circuit microelectronic fabrication, lateral double diffused metal oxide semiconductor (LDMOS) devices are nonetheless not entirely without problems in the art of semiconductor integrated circuit microelectronic fabrication. In that regard, it is often difficult within the art of semiconductor integrated circuit microelectronic fabrication to efficiently fabricate lateral double diffused metal oxide semiconductor (LDMOS) devices with enhanced performance.

It is thus desirable in the art of semiconductor integrated circuit microelectronic fabrication to provide lateral double diffused metal oxide semiconductor (LDMOS) devices which may be efficiently fabricated with enhanced performance.

It is towards the foregoing object that the present invention is directed.

Various lateral double diffused metal oxide semiconductor (LDMOS) devices having desirable properties, and methods for fabrication thereof, have been disclosed in the art of semiconductor integrated circuit microelectronic fabrication.

Included among the lateral double diffused metal oxide semiconductor (LDMOS) devices and methods for fabrication thereof, but not limiting among the lateral double diffused metal oxide semiconductor (LDMOS) devices and methods for fabrication thereof, are lateral double diffused metal oxide semiconductor (LDMOS) devices and methods for fabrication thereof disclosed within: (1) Eklund, in U.S. Pat. No. 5,146,298 (a semiconductor device which may function as either a lateral double diffused metal oxide semiconductor (LDMOS) device or a bipolar transistor device, by fabricating the semiconductor device with an extended drain region); and (2) Ludikhuize, in U.S. Pat. No. 6,288,424 (a lateral double diffused metal oxide semiconductor (LDMOS) device with attenuated charge carrier to substrate charge injection, through use of a buried screening layer fabricated within the lateral double diffused metal oxide semiconductor (LDMOS) device).

Desirable in the art of semiconductor integrated circuit microelectronic fabrication are additional lateral double diffused metal oxide semiconductor (LDMOS) devices which may be efficiently fabricated with enhanced performance.

It is towards the foregoing object that the present invention is directed.

SUMMARY OF THE INVENTION

A first object of the present invention is to provide a lateral double diffused metal oxide semiconductor (LDMOS) device.

A second object of the present invention is to provide the lateral double diffused metal oxide semiconductor (LDMOS) device in accord with the first object of the present invention, wherein the lateral double diffused metal oxide semiconductor (LDMOS) device is efficiently fabricated with enhanced performance.

In accord with the present invention, there is provided by the present invention a lateral double diffused metal oxide semiconductor (LDMOS) device and a method for fabricating the lateral double diffused metal oxide semiconductor (LDMOS) device.

The lateral double diffused metal oxide semiconductor (LDMOS) device comprises in a first instance a semiconductor substrate of a first polarity having formed thereupon an epitaxial layer of a second polarity opposite the first polarity. The lateral double diffused metal oxide semiconductor (LDMOS) device also comprises a source region of the first polarity separated from a well region of the first polarity by a channel region of the second polarity, the well region having formed therein and further separated from the channel region a drain region of the first polarity, where the source region, the channel region, the well region and the drain region are formed laterally sequentially adjoining within the epitaxial layer. The lateral double diffused metal oxide semiconductor (LDMOS) device also comprises a gate electrode formed over the channel region. Finally, the lateral double diffused metal oxide semiconductor (LDMOS) device comprises a buried layer isolation region of the first polarity formed aligned beneath the well region and separated therefrom by a portion of the epitaxial layer.

The lateral double diffused metal oxide semiconductor (LDMOS) device in accord with the present invention contemplates a method for fabricating the lateral double diffused metal oxide semiconductor (LDMOS) device in accord with the present invention.

The present invention provides a lateral double diffused metal oxide semiconductor (LDMOS) device, wherein the lateral double diffused metal oxide semiconductor (LDMOS) device may be efficiently fabricated with enhanced performance.

The present invention realizes the foregoing object by forming within a lateral double diffused metal oxide semiconductor (LDMOS) device a buried layer isolation region of a first polarity formed aligned beneath a well region of the first polarity (in turn having formed therein a drain region of the first polarity) and separated therefrom by a portion of an epitaxial layer of a second polarity opposite the first polarity.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a lateral double diffused metal oxide semiconductor (LDMOS) device, wherein the lateral double diffused metal oxide semiconductor (LDMOS) device may be efficiently fabricated with enhanced performance.

The present invention realizes the foregoing object by forming within a lateral double diffused metal oxide semiconductor (LDMOS) device a buried layer isolation region of a first polarity formed aligned beneath a well region of the first polarity (in turn having formed therein a drain region of the first polarity) and separated therefrom by a portion of an epitaxial layer of a second polarity opposite the first polarity.

Although the preferred embodiment of the present invention illustrates the present invention most particularly within the context of an P channel lateral double diffused metal oxide semiconductor (LDMOS) device comprising in a first instance a P substrate having formed thereupon an N epitaxial layer, the present invention is also intended to include an N channel lateral double diffused metal oxide semiconductor (LDMOS) device comprising in a first instance an N substrate having formed thereupon a P epitaxial layer, and where all remaining semiconductor structures have a complementary polarity to their equivalent structures as illustrated within the preferred embodiment of the present invention.

Referring now to FIG. 1 to FIG. 6, there is shown a series of schematic cross-sectional diagrams illustrating the results of progressive stages of forming, in accord with a preferred embodiment of the present invention, a lateral double diffused metal oxide semiconductor (LDMOS) device within a semiconductor integrated circuit microelectronic fabrication.

Figure 1:
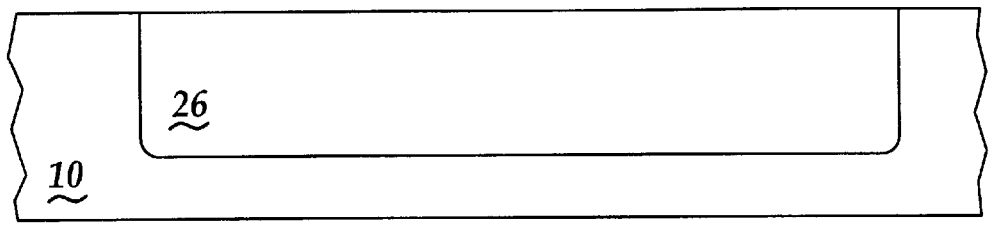
FIG. 1, FIG. 2, FIG. 3, FIG. 4, FIG. 5 and FIG. 6 show a series of schematic cross-sectional diagrams illustrating the results of progressive stages of forming, in accord with a preferred embodiment of the present invention, a lateral double diffused metal oxide semiconductor (LDMOS) device within a semiconductor integrated circuit microelectronic fabrication.

Shown in FIG. 1 is a schematic cross-sectional diagram of the semiconductor integrated circuit microelectronic fabrication at an early stage in its fabrication in accord with the preferred embodiment of the present invention.

Shown in FIG. 1 is a semiconductor substrate 10 having formed therein a first buried layer 26. As is illustrated within the schematic cross-sectional diagram of FIG. 1, the semiconductor substrate 10 is a P semiconductor substrate and the first buried layer 26 is an N buried layer, although, as noted above, the semiconductor substrate 10 may alternatively be an N semiconductor substrate and the first buried layer 26 may alternatively be a P buried layer. Within the preferred embodiment of the present invention, the semiconductor substrate 10 typically and preferably has a P dopant concentration of from about 7E14 to about 2E15 dopant atoms per cubic centimeter and the first buried layer 26 typically and preferably has an N dopant concentration of from about 7E14 to about 2E15 dopant atoms per cubic centimeter. Finally, although semiconductor substrates and buried layers are known in the art of semiconductor integrated circuit microelectronic fabrication as being formed employing semiconductor materials of several varieties, including but not limited to silicon semiconductor materials, germanium semiconductor materials, silicon-germanium semiconductor materials and compound (i.e., III–V and II–VI) semiconductor materials, any of which may be employed within the context of the present invention, for the preferred embodiment of the present invention, both the semiconductor substrate 10 and the first buried layer 12 are typically and preferably formed of a (100) silicon semiconductor material.

Figure 2:
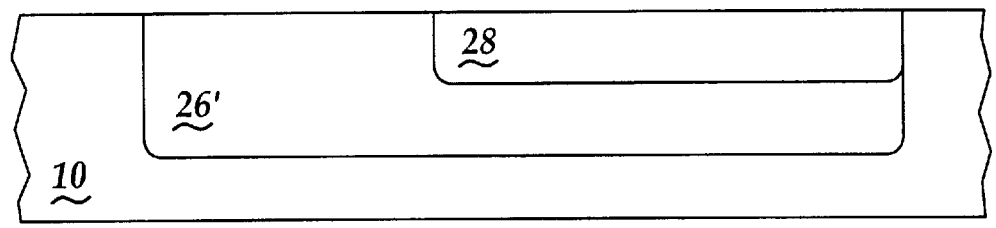

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein there is formed nested within the first buried layer 26 a second buried layer 28 to form from the first buried layer 26 a partially retrodoped first buried layer 26'.

Within the preferred embodiment of the present invention with respect to the second buried layer 28, the second buried layer 28 is formed with a dopant concentration of from about 5E16 to about 5E18 dopant atoms per cubic centimeter, as generally provided employing an ion implantation method employing an ion implantation dose of from about 1E13 to about 1E15 dopant ions per square centimeter and an ion implantation energy of from about 60 to about 150 kev.

Figure 3:
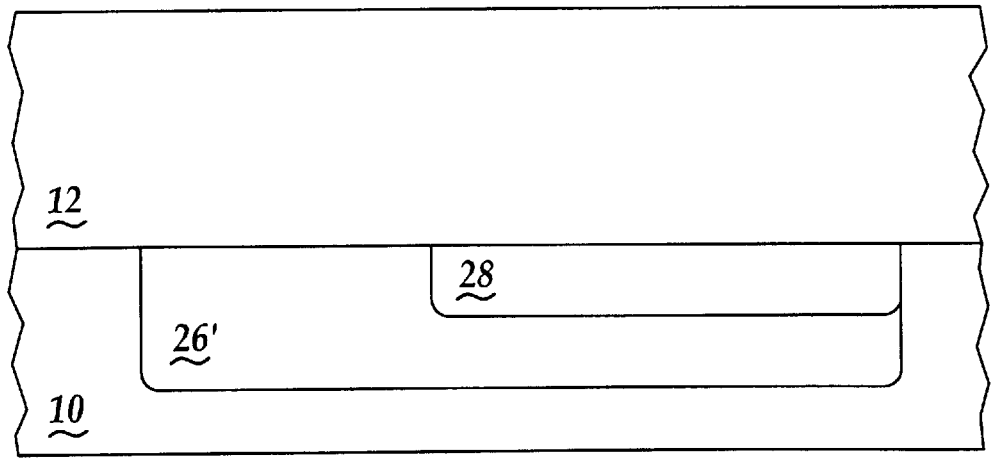

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein, in a first instance, there is formed upon the semiconductor substrate 10 having formed therein the retrodoped first buried layer 26' and the second buried layer 28 an epitaxial layer 12.

Within the preferred embodiment of the present invention with respect to the epitaxial layer 12, and as is illustrated within the schematic cross-sectional diagram of FIG. 3, the epitaxial layer 12 is an N epitaxial layer. Typically and preferably, the epitaxial layer 12 is formed of materials analogous or equivalent to the materials as are employed for fabricating the semiconductor substrate 10, but of an opposite polarity.

Figure 4:
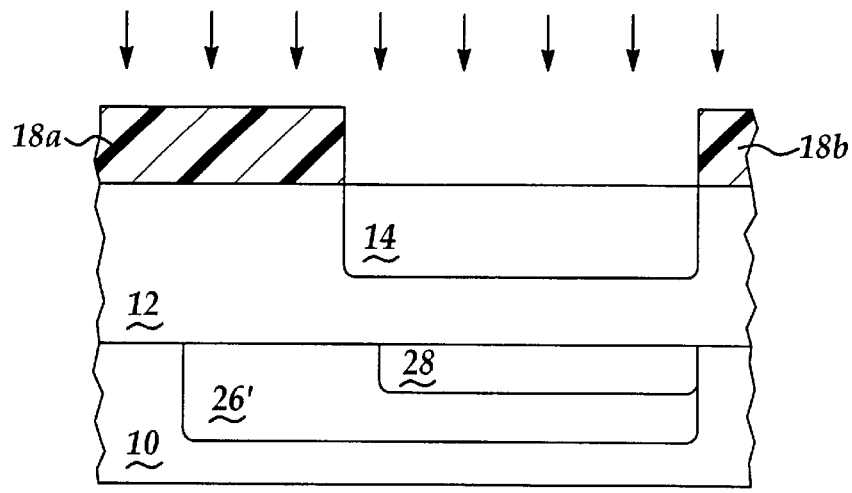

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein there is formed within the epitaxial layer 12, while employing a pair of patterned photoresist layers 18a and 18b in conjunction with a dose of implanting ions 32, a well region 14.

As is illustrated within the schematic cross-sectional diagram of FIG. 4, the well region 14 is formed of P dopant polarity, and it is nonetheless still separated from the second buried layer 28 by an intervening portion of the epitaxial layer 12. To form from the semiconductor integrated circuit microelectronic fabrication whose schematic cross-sectional diagram is illustrated in FIG. 3 the semiconductor integrated circuit microelectronic fabrication whose schematic cross-sectional diagram is illustrated in FIG. 4 the dose of second implanting ions 32 is provided at an ion implantation dose of from about 2E12 to about 5E13 ions per square centimeter and an ion implantation energy of from about 30 to about 80 kev to provide the well region 14 of P dopant concentration from about 1E16 to about 5E17 dopant atoms per cubic centimeter.

Within the preferred embodiment of the present invention under circumstances where the epitaxial layer 12 is formed to a thickness of from about 80,000 to about 200,000 angstroms: (1) the well region 14 is formed to a depth of from about 10,000 to about 45,000 angstroms within the epitaxial layer 12; (2) the second buried layer 28 is formed to a thickness from about 18,000 to about 30,000 angstroms abutting the partially retrodoped first buried layer 26'; and (3) there remains a thickness of the epitaxial layer 12 interposed between the well region 14 and the second buried layer 28 of from about 42,000 to about 72,000 angstroms.

Figure 5:
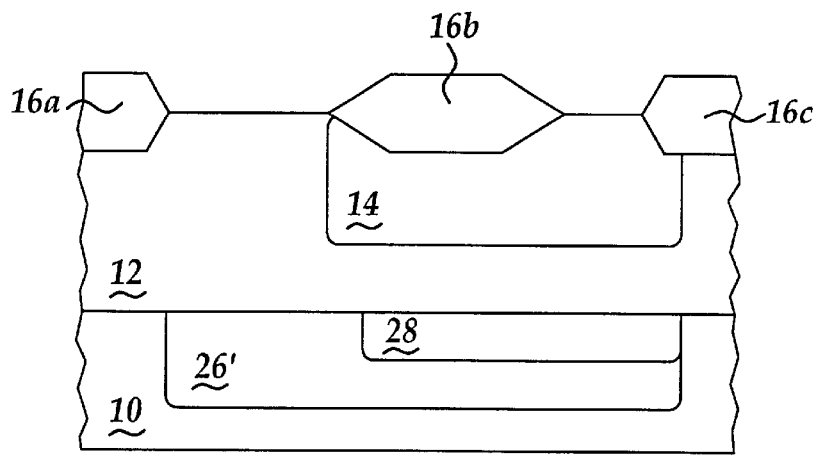

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein there is formed into the surface of the epitaxial layer 12 a series of isolation regions 16a, 16b and 16c.

Within the preferred embodiment of the present invention, the series of isolation regions 16a, 16b and 16c may be formed employing methods as are conventional in the art of semiconductor integrated circuit microelectronic fabrication, including but not limited to isolation region thermal growth methods and isolation region deposition/patterning methods.

Figure 6:
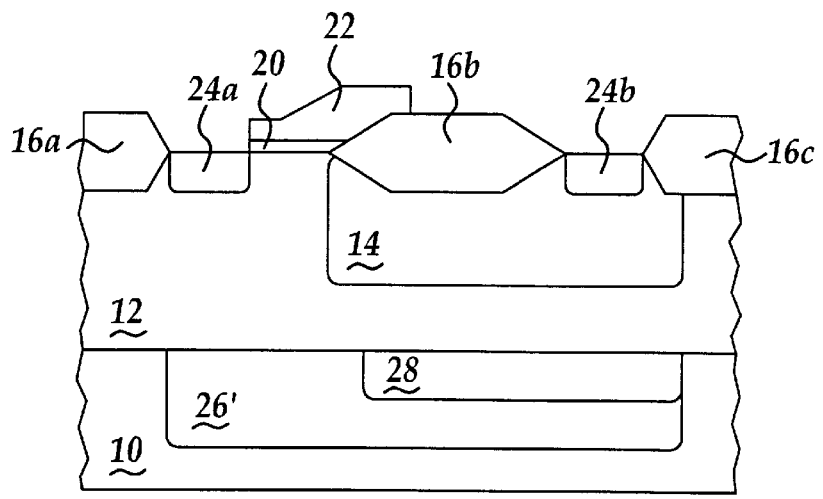

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein, in a first instance, there is formed upon a portion of the epitaxial layer 12 exposed between the pair of isolation regions 16a and 16b, while adjoining the isolation region 16b, a gate dielectric layer 20. In turn, the gate dielectric layer 20 has formed in part aligned thereupon a gate electrode 22 such as to leave exposed a remaining portion of the epitaxial layer 12 exposed interposed between the pair of isolation regions 16a and 16b.

Within the preferred embodiment of the present invention, the gate dielectric layer 20 may be formed employing methods and materials as are otherwise generally conventional in the art of semiconductor integrated circuit microelectronic fabrication. Typically and preferably, the gate dielectric layer 20 is formed to a thickness of from about 130 to about 270 angstroms, and formed at least in part of a silicon oxide dielectric material. Within the preferred embodiment of the present invention with respect to the gate electrode 22, the gate electrode 22 may similarly also be formed employing methods and materials as are conventional in the art of semiconductor integrated circuit microelectronic fabrication. Typically and preferably, the gate electrode is formed to a thickness of from about 2500 to about 4500 angstroms, and it is formed at least in part of a polysilicon material.

Finally, there is also shown within the schematic cross-sectional diagram of FIG. 6: (1) a source region 24a formed into the remaining portion of the epitaxial layer 12 exposed interposed between the pair of isolation regions 16a and 16b; as well as (2) a drain region 24b formed into the well region 14 as exposed interposed between the pair of isolation regions 16b and 16c.

As is illustrated within the schematic cross-sectional diagram of FIG. 6, each of the source region 24a and the drain region 24b is formed of a P polarity. Typically and preferably, each of the source region 24a and the drain region 24b is formed in a self aligned fashion while employing adjoining structures as a mask, and while employing a single ion implantation method. Typically and preferably, the ion implantation method employs a dose of from about 3E15 to about 9E15 dopant atoms per square centimeter and an ion implantation energy of from about 50 to about 100 kev, to provide the source region 24a and the drain region 24b of P dopant concentration from about 1E19 to about 5E19 dopant atoms per cubic centimeter.

Upon forming the semiconductor integrated circuit microelectronic fabrication whose schematic cross-sectional diagram is illustrated in FIG. 6, there is efficiently fabricated within the semiconductor integrated circuit microelectronic fabrication a lateral double diffused metal oxide semiconductor (LDMOS) device with enhanced performance. The lateral double diffused metal oxide semiconductor (LDMOS) device is efficiently fabricated with the enhanced performance at least in part insofar as the lateral double diffused metal oxide semiconductor (LDMOS) semiconductor device has formed therein a well region laterally fully aligned, or at least laterally symmetrically aligned, with a second buried layer, each of a first polarity, wherein the well region and the second buried layer are in turn separated by a portion of an epitaxial layer formed of a second dopant polarity opposite the first polarity.

EXAMPLES

In order to theoretically illustrate the value of the present invention, there was undertaken a computer simulation for a pair of lateral double diffused metal oxide semiconductor (LDMOS) devices, one not in accord with the present invention (i.e., absent a second buried layer) and a second in accord with the present invention (i.e., with a second buried layer).

The computer simulation was undertaken while employing Tsuprem4 v6.4 Medici v3.0 rom Avanti Corporation.

Figure 7:
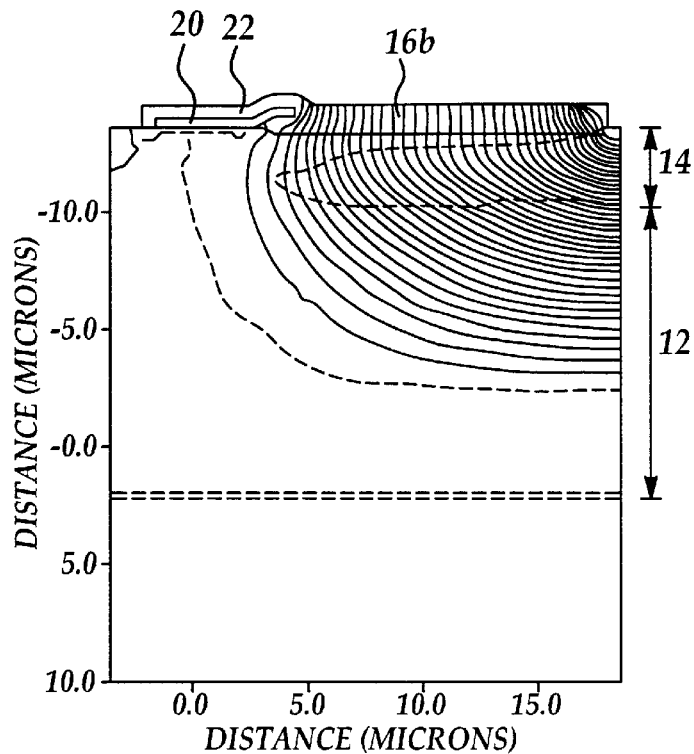
FIG. 7 and FIG. 8 show a pair of graphs illustrating electrical field gradients within a pair of lateral double diffused metal oxide semiconductor (LDMOS) devices, one not fabricated in accord with the present invention and the other fabricated in accord with the present invention.
Figure 8:
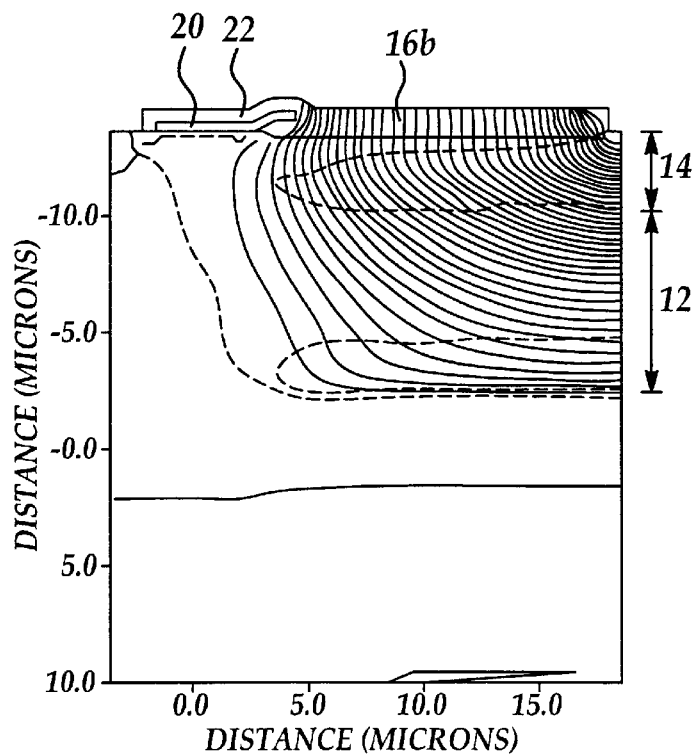

Shown within FIG. 7 and FIG. 8 are graphical results of the computer simulation.

Within both FIG. 7 and FIG. 8, reference numeral 20 corresponds with a gate dielectric layer, reference numeral 22 corresponds with a gate electrode and reference numeral 16b corresponds with an isolation region as otherwise defined within the foregoing description. Similarly, reference numeral 14 corresponds with a well region and reference numeral 12 corresponds with an epitaxial layer. Shown only within FIG. 8, which corresponds with the preferred embodiment of the present invention, is reference numeral 26 which corresponds with a second buried layer.

As is illustrated by comparison of the graphs of FIG. 7 and FIG. 8, electric field gradients are much sharper (i.e., less rounded) within a lateral double diffused metal oxide semiconductor (LDMOS) device fabricated in accord with the present invention.

In order to experimentally illustrate the value of the present invention, there was fabricated: (1) a lateral double diffused metal oxide semiconductor (LDMOS) device in accord with the preferred embodiment of the present invention as illustrated within the schematic cross-sectional diagram of FIG. 6; and (2) an additional equivalent lateral double diffused metal oxide semiconductor (LDMOS) device, but absent the second buried layer 28. The second buried layer was formed with a P dopant concentration of about 1E17 dopant atoms per cubic centimeter, and it was at least laterally symmetrically aligned to, but vertically separated from, the P well by about 60,000 angstroms.

There was then obtained a series of electrical measurements for the pair of lateral double diffused metal oxide semiconductor (LDMOS) devices at 100 volts and 200 volts. The measurements were obtained employing methods and instrumentation as is otherwise conventional in the art of semiconductor integrated circuit microelectronic fabrication, and they included breakdown voltages, drain saturation currents and resistances. The results of the measurements are provided in Table I as follows.

TABLE I

|  | Without BL | With BL | % Enhancement |
| --- | --- | --- | --- |
| BVoff-100 V (volts) | 138 | 153 | 10.9 |
| BVoff-200 V (volts) | 212 | 325 | 10.0 |
| BVon-100 V (volts) | 130 | 140 | 7.7 |
| BVon-200 V (volts) | 180 | 200 | 11.1 |
| Idsat-100 V (amp) | 7.59E−5 | 7.98E−5 | 5.1 |
| Idsat-200 V (amp) | 4.53 | 5.17 | 14.2 |
| Ron-100 V (ohm-cm$^2$) | 0.0189 | 0.018 | 4.1 |
| Ron-200 V (ohm-cm$^2$) | 0.105 | 0.092 | 12.0 |

As is seen from review of the data within Table I, in all circumstances and for all measured parameters, there is observed an improvement in electrical performance for a lateral double diffused metal oxide semiconductor (LDMOS) device fabricated in accord with the present invention.

As is understood by a person skilled in the art, the preferred embodiment and examples of the present invention are illustrative of the present invention rather than limiting of the present invention. Revisions and modifications may be made to methods, materials, structures and dimensions employed for fabricating a lateral double diffused metal oxide semiconductor (LDMOS) device in accord with the preferred embodiment and examples of the present invention while still providing a lateral double diffused metal oxide semiconductor (LDMOS) device in accord with the present invention, further in accord with the accompanying claims.

What is claimed is:

1. A lateral double diffused metal oxide semiconductor device comprising:

a semiconductor substrate of a first polarity having formed thereupon an epitaxial layer of a second polarity opposite the first polarity;

a source region of the first polarity separated from a well region of the first polarity by a channel region of the second polarity, the well region having formed therein and further separated from the channel region a drain region of the first polarity, the source region, the channel region, the well region and the drain region being formed laterally sequentially adjoining within the epitaxial layer;

a gate electrode formed over the channel region;

a buried layer of the second polarity formed encompassing an interface of the semiconductor substrate and the epitaxial layer, and beneath the well region; and a buried layer of the first polarity formed within the buried layer of the second polarity and also laterally symmetrically aligned beneath the well region and separated therefrom by a portion of the epitaxial layer.

2. The lateral double diffused metal oxide semiconductor device of claim 1 wherein the lateral double diffused metal oxide semiconductor device is a P channel device.

3. The lateral double diffused metal oxide semiconductor device of claim 1 wherein the lateral double diffused metal oxide semiconductor device is an N channel device.

4. The lateral double diffused metal oxide semiconductor device of claim 1 wherein the buried layer is separated from the well region by a thickness of from about 42,000 to about 72,000 angstroms of the epitaxial layer.

5. The lateral double diffused metal oxide semiconductor device of claim 4 wherein the second buried layer is formed below and adjoining the buried layer.

* * * * *